United States Patent
Wang et al.

(10) Patent No.: US 12,298,612 B2
(45) Date of Patent: May 13, 2025

(54) ELECTRONIC DEVICE

(71) Applicant: InnoLux Corporation, Miao-Li County (TW)

(72) Inventors: Jo-Hsin Wang, Miao-Li County (TW); Hong-Sheng Hsieh, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 18/461,765

(22) Filed: Sep. 6, 2023

(65) Prior Publication Data
US 2024/0118565 A1   Apr. 11, 2024

(30) Foreign Application Priority Data
Oct. 10, 2022   (CN) .......................... 202211233031.2

(51) Int. Cl.
*G02F 1/13*   (2006.01)
*G02B 5/30*   (2006.01)
*G02F 1/139*   (2006.01)

(52) U.S. Cl.
CPC .......... *G02F 1/1323* (2013.01); *G02B 5/3083* (2013.01); *G02F 1/1393* (2013.01); *G02F 1/1396* (2013.01)

(58) Field of Classification Search
CPC ..... G02F 1/1323; G02F 1/1393; G02F 1/1396
See application file for complete search history.

(56) References Cited

U.S. PATENT DOCUMENTS

| | | | |
|---|---|---|---|
| 11,320,680 B2 | 5/2022 | Fang et al. | |
| 11,467,450 B2 | 10/2022 | Zhong et al. | |
| 2006/0209239 A1 | 9/2006 | Lin | |
| 2019/0056589 A1* | 2/2019 | Sakai | B60K 35/00 |
| 2019/0331944 A1* | 10/2019 | Fang | G02B 6/0055 |
| 2021/0036264 A1* | 2/2021 | Hu | G02B 5/3058 |
| 2021/0055582 A1 | 2/2021 | Chen et al. | |
| 2021/0333580 A1* | 10/2021 | Matsushima | G02F 1/133528 |

(Continued)

FOREIGN PATENT DOCUMENTS

| | | |
|---|---|---|
| CN | 1834726 A | 9/2006 |
| CN | 210573094 U | 5/2020 |
| CN | 114141143 A | 3/2022 |

(Continued)

OTHER PUBLICATIONS

Partial European Search Report dated Feb. 26, 2024, issued in application No. EP 23195929.7.

*Primary Examiner* — Dung T Nguyen
*Assistant Examiner* — David Y Chung
(74) *Attorney, Agent, or Firm* — McClure, Qualey & Rodack, LLP

(57) ABSTRACT

An electronic device is provided. The electronic device includes a display panel, a light-controlling layer, a retardation layer, and a first linear polarizer. The light-controlling layer is disposed between the display panel and the retardation layer. The retardation layer is disposed between the light-controlling layer and the first linear polarizer. A first transmission direction of the first linear polarizer is different from a second transmission direction of at least a portion of an incident light. The incident light passes through the retardation layer so as to enter the first linear polarizer.

17 Claims, 8 Drawing Sheets

(56) References Cited

U.S. PATENT DOCUMENTS

2021/0405457 A1* 12/2021 Zhong ............... G02F 1/133638
2022/0043309 A1*  2/2022 Johnson ............ G02F 1/133605

FOREIGN PATENT DOCUMENTS

| JP | 2006309956 A | 11/2006 |
| TW |  202037939 A | 10/2020 |
| TW |  202122878 A |  6/2021 |

* cited by examiner

ELECTRONIC DEVICE

CROSS REFERENCE TO RELATED APPLICATIONS

This Application claims priority of China Patent Application No. CN 202211233031.2, filed on Oct. 10, 2022, the entirety of which is incorporated by reference herein.

TECHNICAL FIELD

Some embodiments of the present disclosure relate to an electronic device, and, in particular, to an electronic device that includes a retardation layer and has a privacy function.

BACKGROUND

Recently, in order to improve the convenience of life, electronic devices are widely used in various environments. For example, an electronic device including a display device can be applied to a vehicle devices, portable devices, and the like. However, the reflected light generated by ambient light irradiating (hitting) the electronic device, for example, the metal wiring inside the electronic device may cause problems with high amounts of reflected light. Thus, the viewing of the electronic device, as observed by the user, may be affected, and portions of the screen may be difficult to see clearly. Moreover, the safety while driving may be affected.

Although existing electronic devices have been adequate for their intended purposes, they have not been entirely satisfactory in all respects. There are still some problems to be overcome with respect to electronic devices.

SUMMARY

In some embodiments, an electronic device is provided. The electronic device includes a display panel, a light-controlling layer, a retardation layer, and a first linear polarizer. The light-controlling layer is disposed between the display panel and the retardation layer. The retardation layer is disposed between the light-controlling layer and the first linear polarizer. A first transmission direction of the first linear polarizer is different from a second transmission direction of at least a portion of an incident light. The incident light passes through the retardation layer so as to enter the first linear polarizer.

The electronic device of the present disclosure may be applied in various types of electronic apparatus. In order to make the features and advantages of some embodiments of the present disclosure more understand, some embodiments of the present disclosure are listed below in conjunction with the accompanying drawings, and are described in detail as follows.

BRIEF DESCRIPTION OF THE DRAWINGS

The present disclosure can be more fully understood from the following detailed description when read in conjunction with the accompanying drawings. It should be noted that, according to the standard practice in the industry, the various features are not drawn to scale. In fact, the dimensions of the various features may be arbitrarily increased or reduced for clarity.

DETAILED DESCRIPTION

Figure 1:
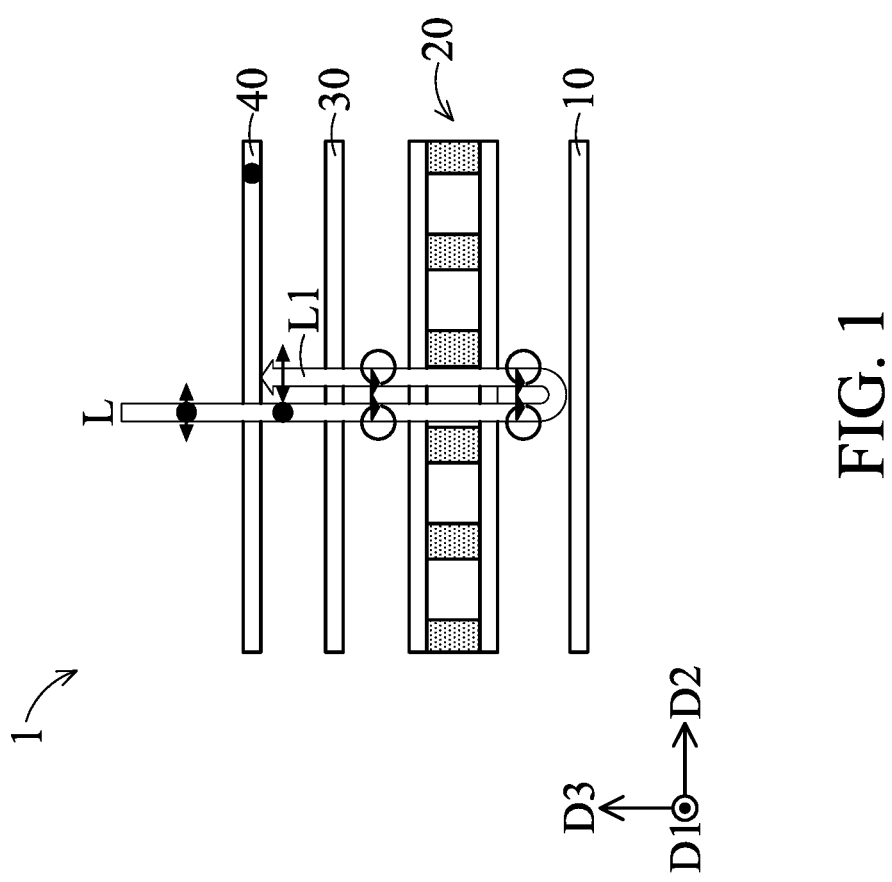
FIG. 1 is a schematic cross-sectional view showing an electronic device according to some embodiments of the present disclosure.

Electronic devices of various embodiments of the present disclosure will be described in detail below. It should be understood that the following description provides many different embodiments for implementing various aspects of some embodiments of the present disclosure. The specific elements and arrangements described below are merely to clearly describe some embodiments of the present disclosure. Of course, these are only used as examples rather than limitations of the present disclosure. Furthermore, similar or corresponding reference numerals may be used in different embodiments to designate similar or corresponding elements in order to clearly describe the present disclosure. However, the use of these similar or corresponding reference numerals is only for the purpose of simply and clearly description of some embodiments of the present disclosure, and does not imply any correlation between the different embodiments or structures discussed.

It should be understood that relative terms, such as "lower", "bottom", "higher", or "top" may be used in various embodiments to describe the relative relationship of one element of the drawings to another element. It will be understood that if the device in the drawings were turned upside down, elements described on the "lower" side would become elements on the "upper" side. The embodiments of the present disclosure can be understood together with the drawings, and the drawings of the present disclosure are also regarded as a portion of the disclosure.

Furthermore, when it is mentioned that a first material layer is located on or over a second material layer, it may include the embodiment which the first material layer and the second material layer are in direct contact and the embodiment which the first material layer and the second material layer are not in direct contact with each other, that is one or more layers of other materials is between the first material layer and the second material layer. However, if the first material layer is directly on the second material layer, it means that the first material layer and the second material layer are in direct contact.

In addition, it should be understood that ordinal numbers such as "first", "second", and the like used in the description and claims are used to modify elements and are not intended to imply and represent the element(s) have any previous ordinal numbers, and do not represent the order of a certain element and another element, or the order of the manufacturing method, and the use of these ordinal numbers is only used to clearly distinguished an element with a certain name and another element with the same name. The claims and the specification may not use the same terms, for example, a first element in the specification may be a second element in the claim.

In some embodiments of the present disclosure, terms related to bonding and connection, such as "connect", "interconnect", "bond", and the like, unless otherwise defined, may refer to two structures in direct contact, or may also refer to two structures not in direct contact, that is there is another structure disposed between the two structures. Moreover, the terms related to bonding and connection can also include embodiments in which both structures are movable, or both structures are fixed. Furthermore, the terms "electrically connected" or "electrically coupled" include any direct and indirect means of electrical connection.

Herein, the terms "approximately", "about", and "substantially" generally mean within 10%, within 5%, within 3%, within 2%, within 1%, or within 0.5% of a given value or range. The given value is an approximate value, that is, "approximately", "about", and "substantially" can still be implied without the specific description of "approximately", "about", and "substantially". The phrase "a range between a first value and a second value" means that the range includes the first value, the second value, and other values in between. Furthermore, any two values or directions used for comparison may have certain tolerance. If the first value is equal to the second value, it implies that there may be a tolerance within about 10%, within 5%, within 3%, within 2%, within 1%, or within 0.5% between the first value and the second value. If the first direction is perpendicular to the second direction, the angle between the first direction and the second direction may be between 80 degrees and 100 degrees. If the first direction is parallel to the second direction, the angle between the first direction and the second direction may be between 0 degrees and 10 degrees.

Certain terms may be used throughout the specification and claims in the present disclosure to refer to specific elements. A person of ordinary skills in the art should be understood that electronic device manufacturers may refer to the same element by different terms. The present disclosure does not intend to distinguish between elements that have the same function but with different terms. In the following description and claims, terms such as "including", "comprising", and "having" are open-ended words, so they should be interpreted as meaning "including but not limited to . . . ". Therefore, when the terms "including", "comprising", and/or "having" is used in the description of the present disclosure, it designates the presence of corresponding features, regions, steps, operations, and/or elements, but does not exclude the presence of one or more corresponding features, regions, steps, operations, and/or elements.

It should be understood that, in the following embodiments, features in several different embodiments may be replaced, recombined, and bonded to complete other embodiments without departing from the spirit of the present disclosure. The features of the various embodiments can be used in any combination as long as they do not violate the spirit of the present disclosure or conflict with each other.

Unless otherwise defined, all terms (including technical and scientific terms) used herein have the same meaning as commonly understood by a person of ordinary skills in the art. It is understood that these terms, such as those defined in commonly used dictionaries, should be interpreted as having meanings consistent with the relevant art and the background or context of the present disclosure, and should not be interpreted in an idealized or overly formal manner, unless otherwise defined in the embodiments of the present disclosure.

Herein, the respective directions are not limited to three axes of the rectangular coordinate system, such as the X-axis, the Y-axis, and the Z-axis, and may be interpreted in a broader sense. For example, the X-axis, the Y-axis, and the Z-axis may be perpendicular to each other, or may represent different directions that are not perpendicular to each other, but the present disclosure is not limited thereto. For convenience of description, hereinafter, the X-axis direction is the first direction D1 (length direction), the Y-axis direction is the second direction D2 (width direction), and the Z-axis direction is the third direction D3 (height direction). In some embodiments, the schematic cross-sectional views described herein are schematic views of the YZ plane.

In some embodiments, the electronic device of the present disclosure may include a display device, a back light device, an antenna device, a sensing device, a privacy device, or a titling device, but the present disclosure is not limited thereto. The electronic device may be a foldable or flexible electronic device. The display device may be a non-self-luminous display device or a self-luminous display device. The antenna device may be a liquid-crystal antenna device or a non-liquid-crystal antenna device. The sensing device may be a sensing device for sensing capacitance, light, heat, or ultrasonic waves, but the present disclosure is not limited thereto. The electronic elements may include passive elements and active elements, such as capacitors, resistors, inductors, diodes, transistors, and the like. The diodes may include light-emitting diodes or photodiodes. The light-emitting diodes may include, for example, organic light-emitting diodes (OLEDs), mini light-emitting diodes (mini LEDs), micro light-emitting diodes (micro LEDs), or quantum dot light-emitting diodes (quantum dot LED), but the present disclosure is not limited thereto. The titling device may be, for example, a display titling device or an antenna titling device, but the present disclosure is not limited thereto. It should be noted that, the electronic device can be any arrangement and combination of the foregoing, but the present disclosure is not limited thereto. The content of the present disclosure will be described below with an electronic device including a display device, but the present disclosure is not limited thereto.

In addition, the shape of the electronic device may be rectangular, circular, polygonal, a shape with curved edges, or another suitable shape. The electronic device may have a peripheral system, such as a processing system, a driving system, a controlling system, a light source system, a shelf system, or the like to support the electronic device.

In some embodiments, additional components may be added to the electronic device of the present disclosure. In some embodiments, some components of the electronic device disclosed herein may be replaced or omitted. In some embodiments, additional processing steps may be provided before, during, and/or after a manufacturing method of an electronic device. In some embodiments, some of the described processing steps may be replaced or omitted, and the order of some of the described processing steps may be interchangeable. Furthermore, it should be understood that some of the described processing steps may be replaced or deleted for other embodiments of the method. Moreover, in the present disclosure, the number and size of each component in the drawings are only for illustration, and are not used to limit the scope of the present disclosure.

Figure 8:
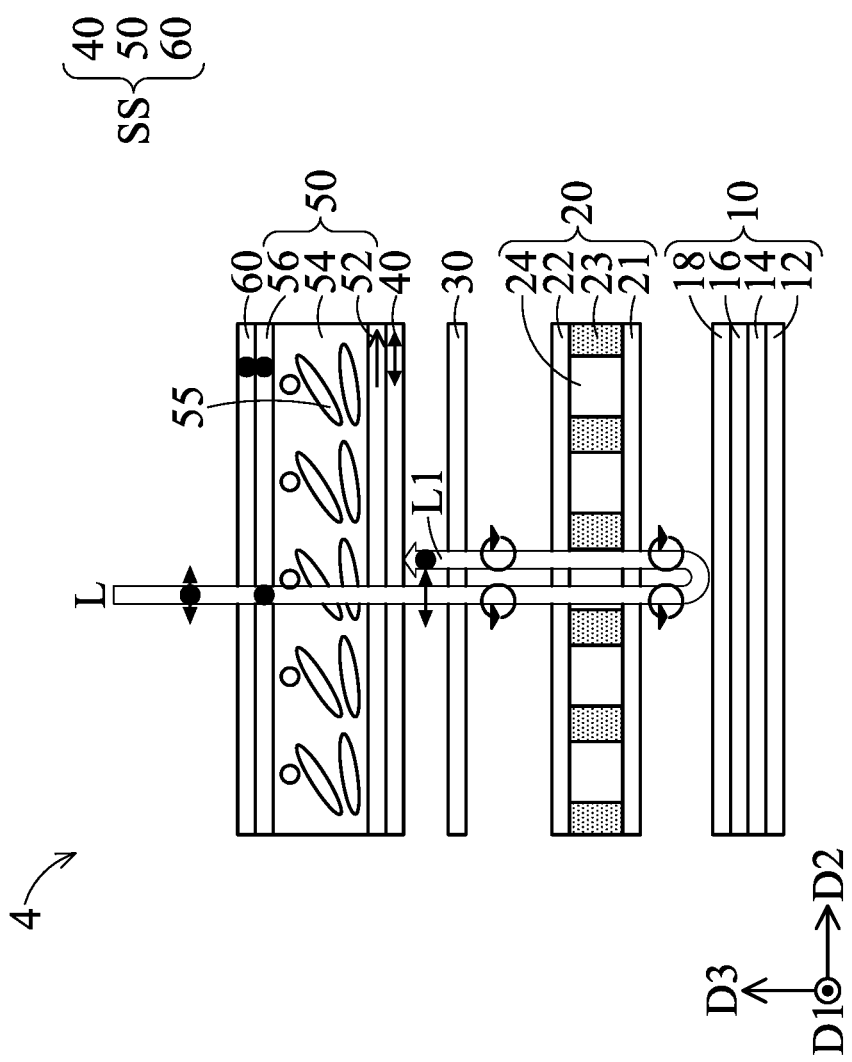
FIG. 8 is a schematic cross-sectional view showing an electronic device according to some embodiments of the present disclosure.

In the present disclosure, a polarizer (that is, a polarizing layer) is an optical element capable of converting an unpolarized light into a polarized light such as a linearly polarized light. In some embodiments, when the direction of the transmission axis of the polarizer is described as the first direction D1 (X-axis direction), a light with a transmission direction (polarization direction) paralleling to the first direction D1 may pass through the polarizer, but the present disclosure is not limited thereto. In the drawings of the present disclosure, the transmission direction of the polarizer is shown on the polarizer (for example, the first linear polarizer 40 and the second linear polarizer 60). In some embodiments, as shown in FIG. 1, a symbol of a dot on the first linear polarizer 40 indicates that the transmission direction of the first linear polarizer 40 is parallel to the first direction D1. In some embodiments, as shown in FIG. 8, a symbol of a double arrow on the first linear polarizer 40 indicates that the transmission direction of the first linear polarizer 40 is parallel to the second direction D2. In some embodiments, when it is described that light passes through the retardation layer, the transmission direction (the direction in which the light passes through) is the polarization direction.

Figure 4:
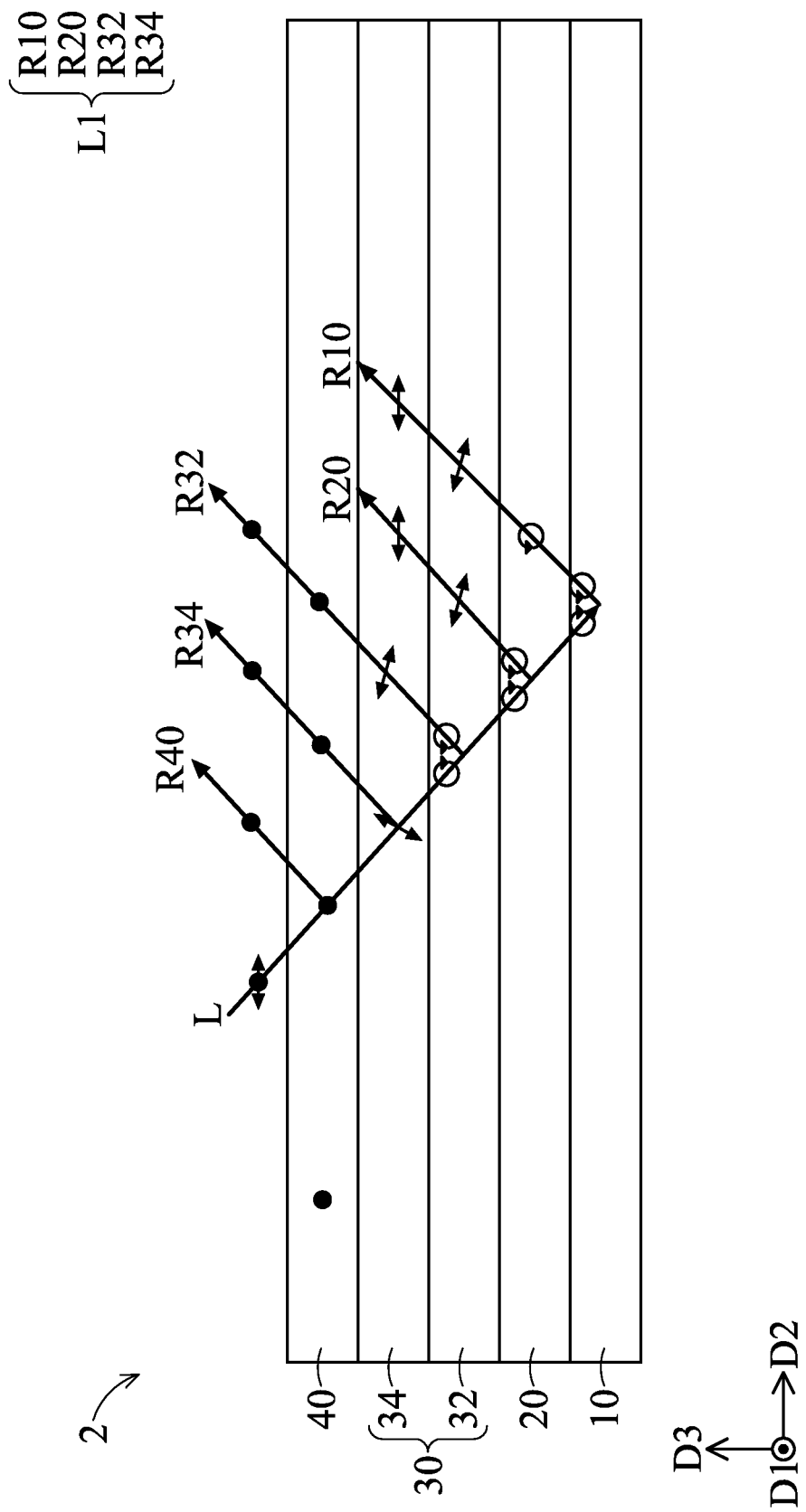
FIG. 4 is a schematic partial cross-sectional view of an electronic device according to some embodiments of the present disclosure.

In the drawings of the present disclosure, the transmission direction of the light may be shown on the light. In some embodiments, as shown in FIG. 1, a symbol of a double arrow with a dot in the middle on the light L indicates that the light L is an unpolarized light. A symbol of a dot on the light L indicates that the light L is a linearly polarized light with the transmission direction of the first direction D1. A symbol of a double arrow on the light L indicates that the light L is a linearly polarized light with the transmission direction of the second direction D2. A symbol of a clockwise arrow on the light L indicates that the light L is a left-handed circularly polarized light or a left-handed elliptical polarized light. A symbol of a counterclockwise arrow on the light L indicates that the light L is a right-handed circularly polarized light or a right-handed elliptical polarized light. The present disclosure is not limited thereto. In some embodiments, as shown in FIG. 4, a symbol of a double arrow having an included angle with the second direction D2 on the light L indicates that the light L is a linearly polarized light with a transmission direction having the abovementioned included angle with the second direction D2. Accordingly, in the drawings of the present disclosure, whether the light L passes through the polarizer can be determined according to the transmission direction of the polarizer and the transmission direction of the light L. (If the transmission direction of the polarizer and the transmission direction of the light L are the same, the light L passes through the polarizer.)

Figure 5:
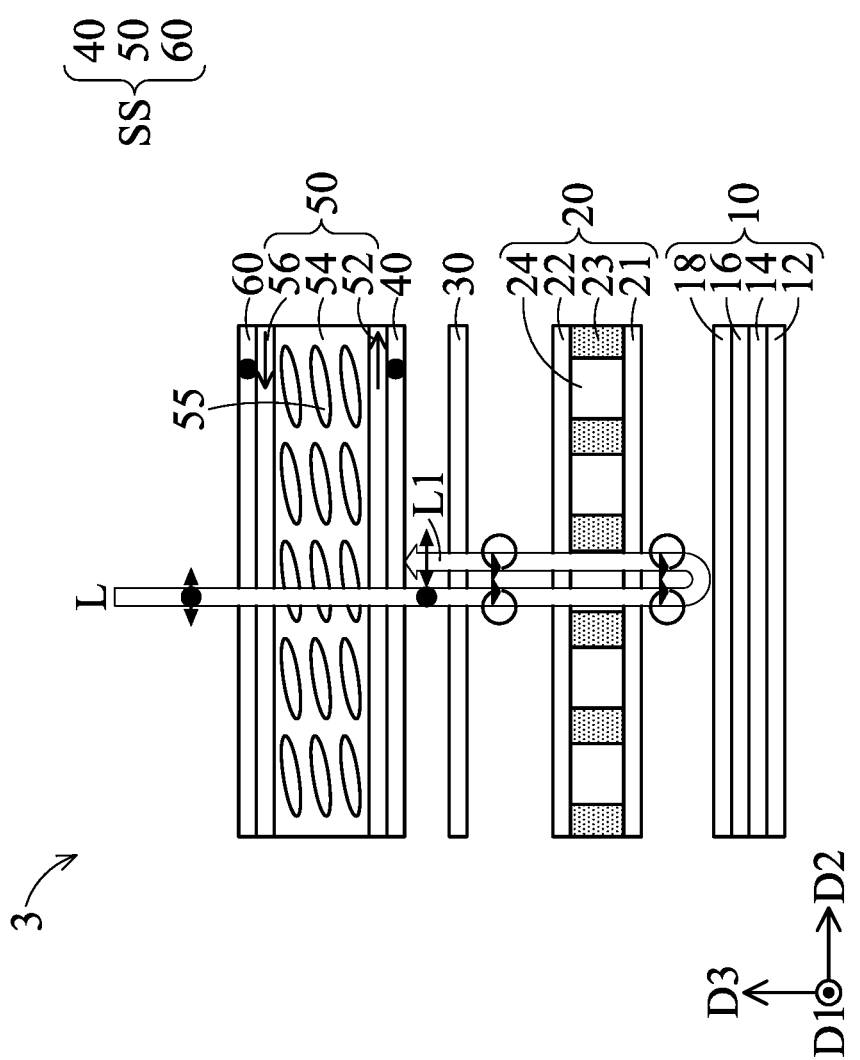
FIG. 5 is a schematic cross-sectional view showing an electronic device according to some embodiments of the present disclosure.

In the drawings of the present disclosure, an alignment direction may be shown on the alignment layer (for example, the first alignment layer 52 and the second alignment layer 56 in FIG. 5). In some embodiments, as shown in FIG. 5, a symbol of a rightward single arrow on the first alignment layer 52 indicates that the alignment direction of the first alignment layer 52 is toward the second direction D2. A symbol of a leftward single arrow on the second alignment layer 56 indicates that the alignment direction of the second alignment layer 56 is toward the opposite direction of the second direction D2.

In the present disclosure, the term "privacy" means that the transmittance is lower than 20%, 10%, 8%, 6%, 5%, 4%, 3%, 2%, 1%, 0.5%, or lower, so that image cannot be observed. In the present disclosure, "reflectivity (reflectance)" is defined as the percentage of incident optical power reflected from a material (to an original incident optical power) within a given wavelength range. In the present disclosure, "low reflectivity" means the reflectivity is lower than 10%, 8%, 6%, 5%, 4%, 3%, 2%, 1%, 0.5%, or lower.

Furthermore, it should be understood that, according to the embodiments of the present disclosure, a viewing angle light distribution diagram, a polarimeter (model: AxoStep), a spectroscopic colorimeter (model: CM-700d), or other suitable methods may be used to observe optical properties. The optical properties are, for example, viewing angle light distributions, phase retardations, polarization states such as linear polarization, elliptical polarization, and circular polarization, reflectivity, and the like. In detail, in some embodiments, the visual effect under the overall viewing angle may be obtained by the viewing angle light distribution diagram, so as to obtain the privacy effect. In some embodiments, the polarization states of various layers may be obtained by the polarimeter. In some embodiments, the reflectivity of the electronic device may be obtained by the spectroscopic colorimeter.

Referring to FIG. 1, it is a schematic cross-sectional view of an electronic device 1 according to some embodiments of the present disclosure. As shown in FIG. 1, the electronic device 1 includes a display panel 10, a light-controlling layer 20, a retardation layer 30, and a first linear polarizer 40. In some embodiments, the display panel 10 may include, or be an organic light-emitting display panel or an inorganic light-emitting display panel. In some embodiments, the display panel 10 may include, or be a self-luminous display panel.

As shown in FIG. 1, in some embodiments, the light-controlling layer 20 is disposed between the display panel 10 and the retardation layer 30. In some embodiments, the light-controlling layer 20 may be used to adjust the viewing angle of the display panel 10 to achieve a passive privacy effect.

As shown in FIG. 1, in some embodiments, the retardation layer 30 may be disposed between the light-controlling layer 20 and the first linear polarizer 40. In some embodiments, the retardation layer 30 may change the polarization state of light. Therefore, the present disclosure may reduce the reflectivity by disposing the retardation layer 30.

In some embodiments, the first linear polarizer 40 may be disposed on the retardation layer 30. In some embodiments, the first linear polarizer 40 may include triacetate fiber (TAC), polyvinyl alcohol (PVA), other suitable polarizing materials, or a combination of the aforementioned materials, but the present disclosure is not limited thereof.

In some embodiments, as shown in FIG. 1, an ambient light (light L) may be incident on the electronic device 1. In the present disclosure, the incident direction of light may be a direction toward the display panel 10. Specifically, the ambient light (light L) may be incident on the first linear polarizer 40, the retardation layer 30, the light-controlling layer 20, and the display panel 10 in the electronic device 1 alone the incident direction. Moreover, the light L is also reflected by the above-mentioned elements, and the light L is reflected along a reflection direction. In the present disclosure, the reflection direction of light may be a direction away from the display panel 10. As shown in FIG. 1, the light reflected by the display panel 10 may pass through the light-controlling layer 20 and the retardation layer 30, and then enter (irradiate) the first linear polarizer 40 again. According to some embodiments, the optical layers in the electronic device 1 may be properly designed, for example, a first transmission direction (for example, the first direction D1) of the first linear polarizer 40 and a second transmission direction (for example, the second direction D2) of at least a portion of a light (marked as light L1) may be different, wherein the light passes through the retardation layer so as to enter the first linear polarizer. Therefore, at least a portion of the light L1 does not pass through the first linear polarizer 40 and is blocked by the first linear polarizer 40, so as to achieve the effect of reducing the reflectivity of the ambient light. In some embodiments, the second transmission direction of the light passing through the retardation layer 30 to enter the first linear polarizer 40 may be perpendicular to the first transmission direction of the first linear polarizer 40. Therefore, the light L1 is substantially unable to pass through the first linear polarizer 40, thereby achieving the effect of reducing the reflectivity of the ambient light. According to some embodiments, the light L1 is a portion of the reflected light of ambient light reflected by the electronic device 1.

In some embodiments, the retardation layer 30 may include a quarter-wave plate to generate a phase difference of a quarter of the wavelength (k). In some embodiments, the retardation layer 30 may further include a half-wave plate to generate a phase difference of half of the wavelength, and the half-wave plate is disposed between the first linear polarizer 40 and the quarter-wave plate. In other embodiments, the retardation layer 30 may further include at least two half-wave plates, and at least two half-wave plates are disposed between the first linear polarizer 40 and the quarter-wave plate. In some embodiments, the retardation layer 30 may include a plurality of sub-layers (such as, the first sub-layer 32 and the second sub-layer 34), and at least one of the plurality of sub-layers is a quarter-wave plate. In some embodiments, one of the plurality of sub-layers closest to the light-controlling layer 20 is a quarter-wave plate. In some embodiments, there may be 2, 3, 4, 5, or 10 sub-layers, or another natural number, but the present disclosure is not limited thereto. According to some embodiments, since the half-wave plate is provided, the reflectivity of light within a predetermined wavelength range may be reduced uniformly, thereby reducing the problem of dispersion. Furthermore, according to some embodiments, by disposing a retardation layer with a specific combination of a half-wave plate and a quarter-wave plate, the problem of dispersion may be reduced, thereby improving the optical performance of the electronic device.

In some embodiments, as shown in FIG. 1, an example may be described for illustration, in which the transmission direction of the first linear polarizer 40 is the first direction D1. The retardation layer 30 is a quarter-wave plate. The light L which is the unpolarized light is incident on the electronic device 1. In some embodiments, light L is ambient light.

As shown in FIG. 1, the light L (such as ambient light) is incident on the electronic device 1 along the incident direction. After the light L passes through (enters) the first linear polarizer 40, since the transmission direction of the first linear polarizer 40 is the first direction D1, the transmission direction of the light L is the first direction D1. Next, after the light L passes through the retardation layer 30, since the retardation layer 30 is the quarter-wave plate, the transmission direction of the light L is a left-handed circularly polarized direction. Then, the light L passes through the light-controlling layer 20, and the light-controlling layer 20 will not change the transmission direction of the light L, so the light L is still left-handed circularly polarized. Afterwards, the light L is reflected by the electronic device 1 along the reflection direction. In detail, the light L is incident on the top surface of the display panel 10 and reflected from the top surface of the display panel 10. Since the light L is reflected from the display panel 10, the phase difference of the reflected light changes by 180 degrees, so the transmission direction of the reflected light reflected by the display panel 10 is a right-handed circularly polarized direction.

Continuing from the foregoing, as shown in FIG. 1, the reflected light continues to pass through the light-controlling layer 20 without changing the transmission direction of the reflected light. Thus, the reflected light is still right-handed circularly polarized after passing through the light-controlling layer 20. Next, after the reflected light passes through the retardation layer 30 again, since the retardation layer 30 is the quarter-wave plate, the transmission direction of the reflected light (marked as light L1) passing through the retardation layer 30 is the second direction D2. According to some embodiments, the first transmission direction of the first linear polarizer 40 is the first direction D1. The second transmission direction of at least a portion of the incident light (light L1) is the second direction D2, and the incident light is incident on the first linear polarizer 40 after passing through the retardation layer 30. When the first transmission direction is different from the second transmission direction, at least a portion of the light L1 does not pass through the first linear polarizer 40, thereby reducing the reflectivity. In detail, even though the light L1 is incident on the electronic device 1, since the retardation layer 30 adjusts the phase difference of the reflected light, the user will not observe the light L1 exited from the first linear polarizer 40 or the user may observe light L1 which is partially blocked, thereby reducing the reflectivity of the electronic device 1.

Hereinafter, the same or similar reference numerals will not be repeated.

Figure 2:
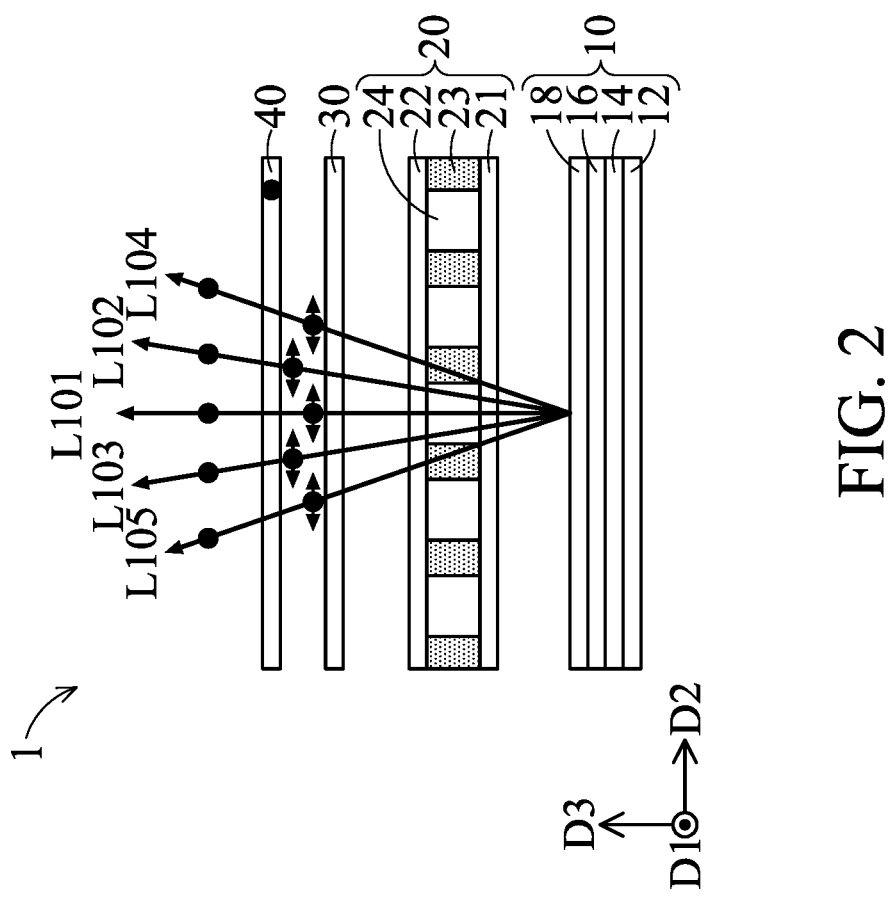
FIG. 2 is a schematic cross-sectional view showing an electronic device according to some embodiments of the present disclosure.

Referring to FIG. 2, it is a schematic cross-sectional view showing an electronic device 1 according to some embodiments of the present disclosure.

In some embodiments, the display panel 10 may further include a substrate 12, a transistor array 14, a light-emitting layer 16, and a capping layer 18. In some embodiments, the substrate 12 may include, or be wafer, chip, glass, quartz, sapphire, ceramic, polyimide (PI), polycarbonate (PC), polyethylene terephthalate (PET), polypropylene (PP), other suitable substrates, or a combination thereof, but the present disclosure is not limited thereto. The substrate 12 may be a rigid substrate or a flexible substrate, and the present disclosure is not limited thereto.

In some embodiments, the transistor array 14 may be disposed on the substrate 12. In some embodiments, the transistor array 14 such as a thin film transistor (TFT) array may be disposed on the substrate 12 to control a light-emitting layer 16. In some embodiments, the transistor array 14 may include driving transistors, switching transistors, other suitable transistors, or a combination thereof, but the present disclosure is not limited thereto.

In some embodiments, the light-emitting layer 16 may be disposed on the transistor array 14. In some embodiments, light-emitting layer 16 may include a light-emitting material. In some embodiments, the light-emitting material may include liquid crystals, quantum dots, organic light-emitting diodes, mini LEDs, micro LEDs, quantum dot LEDs, phosphors, fluorophores, other suitable light-emitting materials, or a combination thereof, but the present disclosure is not limited thereto. In detail, the transistors in the transistor array 14 may be electrically connected to the light-emitting units in the light-emitting layer 16. According to some embodiments, the light-emitting unit may include a liquid-crystal unit, a quantum dot unit, an organic light-emitting diode unit, a mini LED unit, a micro LED unit, a quantum dot LED unit, or a combination thereof. According to some embodiments, the light-emitting unit may include a self-luminous light-emitting unit, for example, an organic light-emitting diode unit or an inorganic light-emitting diode unit.

In some embodiments, a capping layer 18 may be disposed on the light-emitting layer 16 to protect layers below the capping layer 18, such as the light-emitting layer 16. In some embodiments, the capping layer 18 may include, or be glass, polycarbonate, polyethylene terephthalate, polypropylene, other suitable materials, or a combination of the aforementioned materials, but the present disclosure is not limited thereto. In some embodiments, a color filter (not shown) may be further disposed between the light-emitting layer 16 and the capping layer 18. In some embodiments, an electrode layer (not shown) may be further disposed on the light-emitting layer 16 to drive the light-emitting layer 16. In some embodiments, the polarizer in the display panel 10 may be omitted.

In some embodiments, the light-controlling layer 20 may further include a first carrier substrate 21, a second carrier substrate 22, and a light-shielding portion 23 and a light-transmitting portion 24 disposed between the first carrier substrate 21 and the second carrier substrate 22. In some embodiments, the light-shielding portions 23 and the light-transmitting portions 24 may be alternately arranged along the second direction D2. In other words, light may pass through the light-transmitting portion 24 of the light-controlling layer 20, and the light may be blocked by the light-shielding portion 23 of the light-controlling layer 20. Therefore, the light-controlling layer 20 does not substantially change the polarization direction of the light. In some embodiments, a plurality of light-shielding portions 23 may be provided. In some embodiments, when viewed in a top view, for example, when viewed on a plane formed by the first direction D1 and the second direction D2, each of the plurality of light-shielding portions 23 may extend along the first transmission direction (for example, the first direction D1), and a plurality of light-shielding portions 23 may be arranged at intervals in the second transmission direction (for example, the second direction D2). According to some embodiments, the light-controlling layer 20 has a light-shielding portion 23 extending along the first transmission direction (first direction D1). In some embodiments, the light-shielding portion 23 may be strip-shaped and disposed between the first carrier substrate 21 and the second carrier substrate 22. In some embodiments, a plurality of light-transmitting portions 24 may be provided. In some embodiments, when viewed in a top view, for example, when viewed on a plane formed by the first direction D1 and the second direction D2, each of the plurality of light-transmitting portions 24 may extend along the first transmitting direction (for example, the first direction D1). The plurality of light-transmitting portions 24 may be arranged at intervals in the second transmission direction (for example, the second direction D2). That is, the light-transmitting portion 24 may be strip-shaped.

In some embodiments, the first carrier substrate 21 and/or the second carrier substrate 22 may include, or be glass, polyimide (PI), polyethylene terephthalate (PET), other suitable materials, or a combination of the aforementioned materials, but the present disclosure is not limited thereto. In some embodiments, the light-shielding portion 23 may include, or be a polarizing material or a black material. In some embodiments, the light-transmitting portion 24 may include, or be a transparent material. In some embodiments, the transparent material may include polycarbonate (PC), polymerized siloxanes, poly (methyl methacrylate) (PMMA), cyclo-olefin polymer (COP), cyclo-olefin copolymer (COC), other suitable transparent materials, or a combination of the aforementioned materials, but the present disclosure is not limited thereto.

In FIG. 2, it shows the lights L101-L105 emitted from the display panel 10 at different angles. In some embodiments, the lights L101-L105 emitted from the display panel 10 are unpolarized lights or polarized lights. The transmission directions of lights L101-L105 will not be changed after lights L101-L105 passes through the light-transmitting portion 24 of the light-controlling layer 20. Next, the lights L101-L105 are still non-polarized lights after passing through the retardation layer 30. Then, the transmission directions of the lights L101-L105 are the first direction D1 after the lights L101-L105 passes through the first linear polarizer 40. According to some embodiments, with the arrangement of the light-controlling layer 20, the electronic device may have a privacy function. Specifically, as shown in FIG. 2, the lights L104 and L105 are blocked by the light-shielding portion 23 in the light-controlling layer 20 so that the lights do not be emitted or the emitted light is weakened. Therefore, the frontal light emission of the light L101-L103 is not affected. That is, the light-controlling layer 20 may reduce light emission from the side-view (large viewing angle), thus achieving a passive privacy effect. Moreover, as described in FIG. 1 above, the electronic device 1 may achieve the effect of reducing the reflected light while maintaining the privacy function.

Figure 3:
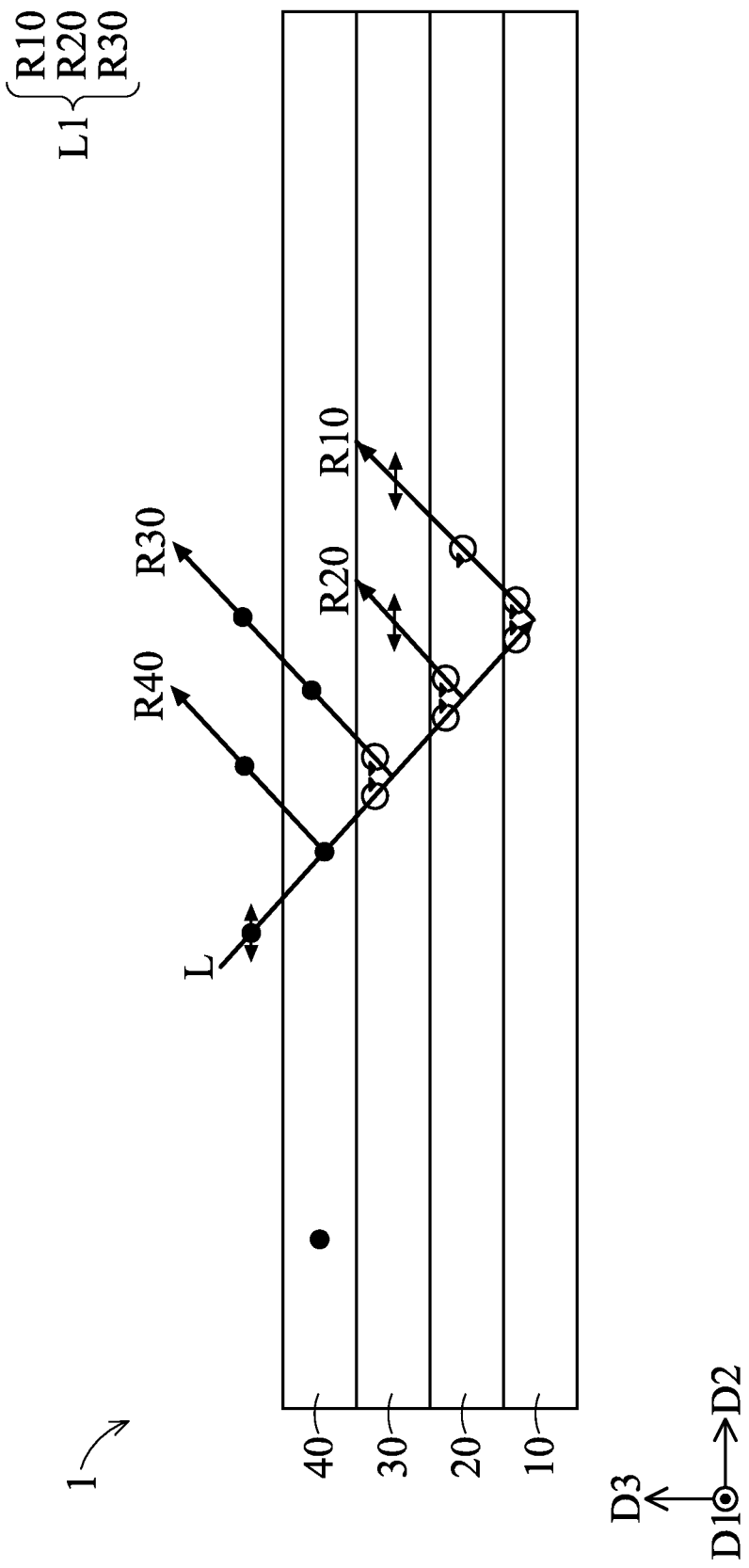
FIG. 3 is a schematic partial cross-sectional view of an electronic device according to some embodiments of the present disclosure.

Referring to FIG. 3, it is a partial cross-sectional schematic view of the electronic device 1 according to some embodiments of the present disclosure. FIG. 3 shows the path of light. The light is incident to each layer in the electronic device 1 and then reflected by each layer in the electronic device 1. In detail, the incident direction of the light is, for example, along the direction from the first linear polarizer 40 to the display panel 10. The reflection direction of the light is, for example, along the direction from the display panel 10 to the first linear polarizer 40. In some embodiments, the light L (for example, ambient light) is incident on the first linear polarizer 40 and is reflected by the first linear polarizer 40 to generate a reflected light R40. Then, the light L continues to be incident on the retardation layer 30 and is reflected by the retardation layer 30 to generate a reflected light R30. Then, the light L continues to be incident on the light-controlling layer 20 and is reflected by the light-controlling layer 20 to generate a reflected light R20. Then, the light L is incident on the display panel 10 and is reflected by the display panel 10 to generate a reflected light R10. As shown in FIG. 3, following the above, an example may be described for illustration, in which the transmission direction of the first linear polarizer 40 is the first direction D1, the retardation layer 30 is a quarter-wave plate, and the light L is the unpolarized light.

In some embodiments, as shown in FIG. 3, the light L incident on the electronic device 1 may be the ambient light, and the transmission direction of the light L is the first direction D1 and the second direction D2. In some embodiments, since the transmission direction of the first linear polarizer 40 is the first direction D1, the transmission direction of the light passing through the first linear polarizer 40 is the first direction D1. Moreover, the transmission direction of the reflected light R40 reflected by the first linear polarizer 40 is the first direction D1. Accordingly, a portion of the light L incident on the first linear polarizer 40 passes through the first linear polarizer 40 (and continues to be incident on the retardation layer 30), and a portion of the light incident on the first linear polarizer 40 is reflected by the first linear polarizer 40 as the reflected light R40.

In some embodiments, as shown in FIG. 3, following the above, the light with transmission direction of the first direction D1 continues to be incident on the retardation layer 30. Since the retardation layer 30 is a quarter-wave plate, the transmission direction of the light passing through the retardation layer 30 is left-handed circularly polarized direction. Furthermore, after the light incident on the retardation layer 30 is reflected by the retardation layer 30 (with a phase difference of 180 degrees), the transmission direction of the reflected light R30 is right-handed circularly polarized direction. Then, after the reflected light R30 passes through the first linear polarizer 40 again, the transmission direction of the reflected light R30 is the first direction D1. Accordingly, a portion of the light incident into the retardation layer 30 passes through the retardation layer 30 (and continues to be incident on the light-controlling layer 20), and a portion of the light incident into the retardation layer 30 is reflected by the retardation layer 30 as the reflected light R30. The reflected light R30 may continue to be emitted from the first linear polarizer 40.

In some embodiments, as shown in FIG. 3, the light-controlling layer 20 may change the viewing angle of the display panel 10 without changing the transmission direction of light. The transmission direction of the light is left-handed circularly polarized direction, wherein the light is from the retardation layer 30 to be incident on the light-controlling layer 20 so as to pass through the light-controlling layer 20. Furthermore, after the light incident on the light-controlling layer 20 is reflected by the light-controlling layer 20 (with a phase difference of 180 degrees), the transmission direction of the reflected light R20 is right-handed circularly polarized direction. Then, after the reflected light R20 passes through the retardation layer 30 again, the transmission direction of the reflected light R20 changes to the second direction D2. Since the transmission direction (second direction D2) of the reflected light R20 is different (for example, perpendicular) from the transmission direction (first direction D1) of the first linear polarizer 40, the reflected light R20 does not pass through the first linear polarizer 40 and may be blocked. Alternatively, according to an embodiment, the light amount of the reflected light R20 passing through the first linear polarizer 40 may be reduced (for example, the light is weakened, the light intensity is reduced, and/or the luminous flux is reduced). Accordingly, a portion of the light incident on the light-controlling layer 20 passes through the light-controlling layer 20 (and continues to be incident on the display panel 10), and a portion of the light incident on the light-controlling layer 20 is reflected by the light-controlling layer 20 as the reflected light R20.

In some embodiments, as shown in FIG. 3, the transmission direction of the light is left-handed circularly polarized direction, wherein the light is from the light-controlling layer 20 to be incident on the display panel 10. Moreover, after the light incident on the display panel 10 is reflected by the display panel 10 (with a phase difference of 180 degrees), the transmission direction of the reflected light R10 is right-handed circularly polarized direction. Then, after the reflected light R10 passes through the light-controlling layer 20 in the reflection direction, the transmission direction of the reflected light R10 is still right-handed circularly polarized direction. Then, after the reflected light R10 passes through the retardation layer 30 again, the transmission direction of the reflected light R10 changes to the second direction D2. Since the transmission direction (second direction D2) of the reflected light R10 is different (for example, perpendicular) from the transmission direction (first direction D1) of the first linear polarizer 40, the reflected light R10 does not pass through the first linear polarizer 40 and may be blocked. Alternatively, according to an embodiment, the light amount of the reflected light R10 passing through the first linear polarizer 40 may be reduced (for example, the light is weakened, the light intensity is reduced, and/or the luminous flux is reduced). Specifically, as shown in FIG. 3, the incident light (light L1) incident on the first linear polarizer 40 after passing through the retardation layer 30 may include three portions (the reflected lights R30, R20, and R10). Wherein the reflected light R30 may continue to pass through the first linear polarizer 40, the reflected light R20 does not pass through the first linear polarizer 40, and the reflected light R10 does not pass through the first linear polarizer 40. According to some embodiments, the first transmission direction (first direction D1) of the first linear polarizer 40 and the second transmission direction (second direction D2) of at least a portion (for example, the reflected lights R20, and R10) of the incident light (light L1) are different, wherein the incident light passes through the retardation layer so as to enter the first linear polarizer. Specifically, in the reflected light of the ambient light reflected by the electronic device 1, at least a portion (reflected light R10 and R20) of the incident light (light L1) passes through the retardation layer to enter the first linear polarizer, and the transmission direction of the portion of the incident light is different from the first transmission direction (first direction D1) of the first linear polarizer 40. That is, the second transmission direction (second direction D2) of the reflected lights R10 and R20 is different from the first transmission direction (first direction D1). Accordingly, when the user observes in a top view, for example, when viewing on the plane formed by the first direction D1 and the second direction D2, the user may observe the reflected light R40 and R30, but will not observe the reflected lights R10 and R20 (because the reflected lights R10 and R20 are blocked by the first linear polarizer 40). Thus, according to some embodiments, by the design of the optical layer in the electronic device, the effect of low reflectivity may be achieved.

According to some embodiments, as shown in FIG. 3, the transmission direction of the first linear polarizer 40 is the first transmission direction (the first direction D1). The light from the retardation layer 30 continues to be incident on the light-controlling layer 20 to pass through the light-controlling layer 20, and then reflected by the light-controlling layer 20. Then, the reflected light R20 passes through the retardation layer 30 again, and transmission direction of the reflected light R20 changes to the second direction D2. On the other hand, after the light passes through the light-controlling layer 20, the light may continue to be incident on the display panel 10 to pass through the display panel 10, and then be reflected by the display panel 10. The reflected light R10 then passes through the light-controlling layer 20 and the retardation layer 30 again. The transmission direction of the reflected light R10 also changes to the second direction D2. By the aforementioned design, the transmission direction (second direction D2) of the reflected light R20 may be different from the transmission direction (first direction D1) of the first linear polarizer 40, and the transmission direction (second direction D2) of the reflected light R10 may be different from the transmission direction (first direction D1) of the first linear polarizer 40. Therefore, the light amount of reflected light R20 and R10 passing through the first linear polarizer 40 may be reduced, thereby reducing the reflection of ambient light. Therefore, the light amount of reflected light reflected by the electronic device from the ambient light may be reduced, thereby reducing the reflection of the ambient light.

Referring to FIG. 4, it is a schematic partial cross-sectional view of an electronic device 2 according to some embodiments of the present disclosure. In some embodiments, as shown in FIG. 4, the light L entering the electronic device 2 may be ambient light, and the transmission direction of the light L is the first direction D1 and the second direction D2. In some embodiments, an example may be described for illustration, in which the retardation layer 30 includes the first sub-layer 32 and the second sub-layer 34, and the light L is unpolarized light. In some embodiments, the first sub-layer 32 is a quarter-wave plate and the second sub-layer 34 is a half-wave plate. According to some embodiments, at least one of the plurality of sub-layers may be a quarter-wave plate. For example, the first sub-layer 32 may be a quarter-wave plate.

In some embodiments, FIG. 4 shows the path of light. The light is incident to each layer in the electronic device 2 and then reflected by each layer in the electronic device 2. In detail, the incident direction of the light is, for example, along the direction from the first linear polarizer 40 to the display panel 10. The reflection direction of the light is, for example, along the direction from the display panel 10 to the first linear polarizer 40. The light L entering the electronic device 2 may be ambient light, and the transmission direction of the light L is the first direction D1 and the second direction D2. The transmission direction of the first linear polarizer 40 is the first direction D1. In some embodiments, after the light L passes through the first linear polarizer 40, the transmission direction of the light is the first direction D1, and the transmission direction of the reflected light R40 reflected by the first linear polarizer 40 is the first direction D1. Accordingly, a portion of the light L incident on the first linear polarizer 40 passes through the first linear polarizer 40 (and continues to be incident on the second sub-layer 34), and a portion of the light incident on the first linear polarizer 40 is reflected by the first linear polarizer 40 as the reflected light R40.

In some embodiments, as shown in FIG. 4, the second sub-layer 34 is the half-wave plate so as to provide a phase difference of one-half-wavelength. Thus, the light with transmission direction of the first direction D1 continues to be incident on the second sub-layer 34 and pass through the second sub-layer 34, and the transmission direction of the light passing through the second sub-layer 34 is linearly polarized with 60 degrees included angle. Furthermore, after the light incident on the second sub-layer 34 is reflected by the second sub-layer 34, the transmission direction of the reflected light R34 is the first direction D1. Then, after the reflected light R34 passes through the first linear polarizer 40, the transmission direction of the reflected light R34 is still the first direction D1. Accordingly, a portion of the light incident on the second sub-layer 34 passes through the second sub-layer 34 (and continues to be incident on the first sub-layer 32), and a portion of the light incident on the second sub-layer 34 is reflected by the second sub-layer 34 as the reflected light R34.

In some embodiments, as shown in FIG. 4, the transmission direction of the light that continues to enter the first sub-layer 32 to pass through the first sub-layer 32 is left-handed circularly polarized direction. Furthermore, after the light incident on the first sub-layer 32 is reflected by the first sub-layer 32 (with a phase difference of 180 degrees), the transmission direction of the reflected light R32 is right-handed circularly polarized direction. Moreover, after the reflected light R32 passes through the second sub-layer 34, the transmission direction of the reflected light R32 is linearly polarized with negative 30 degrees included angle. Furthermore, after the reflected light R32 passes through the first linear polarizer 40 again, the transmission direction of the reflected light R32 is still the first direction D1. (On the other hand, after the reflected light R34 passes through the first linear polarizer 40 again, the transmission direction of the reflected light R34 is also the first direction D1.) Accordingly, a portion of the light incident into the first sub-layer 32 passes through the first sub-layer 32 (and continues to be incident on the light-controlling layer 20), and a portion of the light incident into the first sub-layer 32 is reflected by the first sub-layer 32 as the reflected light R32.

In some embodiments, as shown in FIG. 4, the transmission direction of the light that continues to enter the light-controlling layer 20 to pass through the light-controlling layer 20 is left-handed circularly polarized direction. Furthermore, after the light incident on the light-controlling layer 20 is reflected by the light-controlling layer 20 (with a phase difference of 180 degrees), the transmission direction of the reflected light R20 is right-handed circularly polarized direction. Moreover, after the reflected light R20 passes through the first sub-layer 32, the transmission direction of the reflected light R20 is linearly polarized with negative 30 degrees included angle. Furthermore, after the reflected light R20 passes through the second sub-layer 34 again, the transmission direction of the reflected light R20 changes to the second direction D2. Since the transmission direction of the reflected light R20 is different (for example, perpendicular) from the transmission direction of the first linear polarizer 40, the reflected light R20 does not pass through the first linear polarizer 40 and may be blocked. Alternatively, according to an embodiment, the light amount of the reflected light R20 passing through the first linear polarizer 40 may be reduced (for example, the light is weakened, the light intensity is reduced, and/or the luminous flux is reduced). Accordingly, a portion of the light incident on the light-controlling layer 20 passes through the light-controlling layer 20 (and continues to be incident on the display panel 10), and a portion of the light incident into the light-controlling layer 20 is reflected by the light-controlling layer 20 as the reflection light R20.

In some embodiments, as shown in FIG. 4, the transmission direction of the light that continues to enter the display panel 10 is left-handed circularly polarized direction. Furthermore, after the light incident on the display panel 10 is reflected by the display panel 10 (with a phase difference of 180 degrees), the transmission direction of the reflected light R10 is right-handed circularly polarized direction. Then, after the reflected light R10 passes through the light-controlling layer 20, the transmission direction of the reflected light R10 is right-handed circularly polarized direction. Moreover, after the reflected light R10 passes through the first sub-layer 32 again, the transmission direction of the reflected light R10 is linearly polarized with negative 30 degrees included angle. Furthermore, after the reflected light R10 passes through the second sub-layer 34 again, the transmission direction of the reflected light R10 changes to the second direction D2. Since the transmission direction of the reflected light R10 is different (for example, perpendicular) from the transmission direction of the first linear polarizer 40, the reflected light R10 does not pass through the first linear polarizer 40 and may be blocked. Alternatively, according to an embodiment, the light amount of the reflected light R10 passing through the first linear polarizer 40 may be reduced (for example, the light is weakened, the light intensity is reduced, and/or the luminous flux is reduced). Specifically, as shown in FIG. 4, the second transmission direction (for example, the second direction D2) of at least a portion (for example, the reflected lights R10 and R20) of the incident light (marked as light L1) passing through the retardation layer 30 to enter the first linear polarizer 40 is different from the first transmission direction (for example, the first direction D1) of the first linear polarizer 40. Accordingly, when the user observes in a top view, for example, when viewing on the plane formed by the first direction D1 and the second direction D2, the user may observe the reflected lights R40, R34, and R32, but will not observe the reflected lights R10 and R20 (because the reflected lights R10 and R20 are blocked by the first linear polarizer 40). Thus, according to some embodiments, by the design of the optical layer in the electronic device, the effect of low reflectivity may be achieved.

Figure 6:
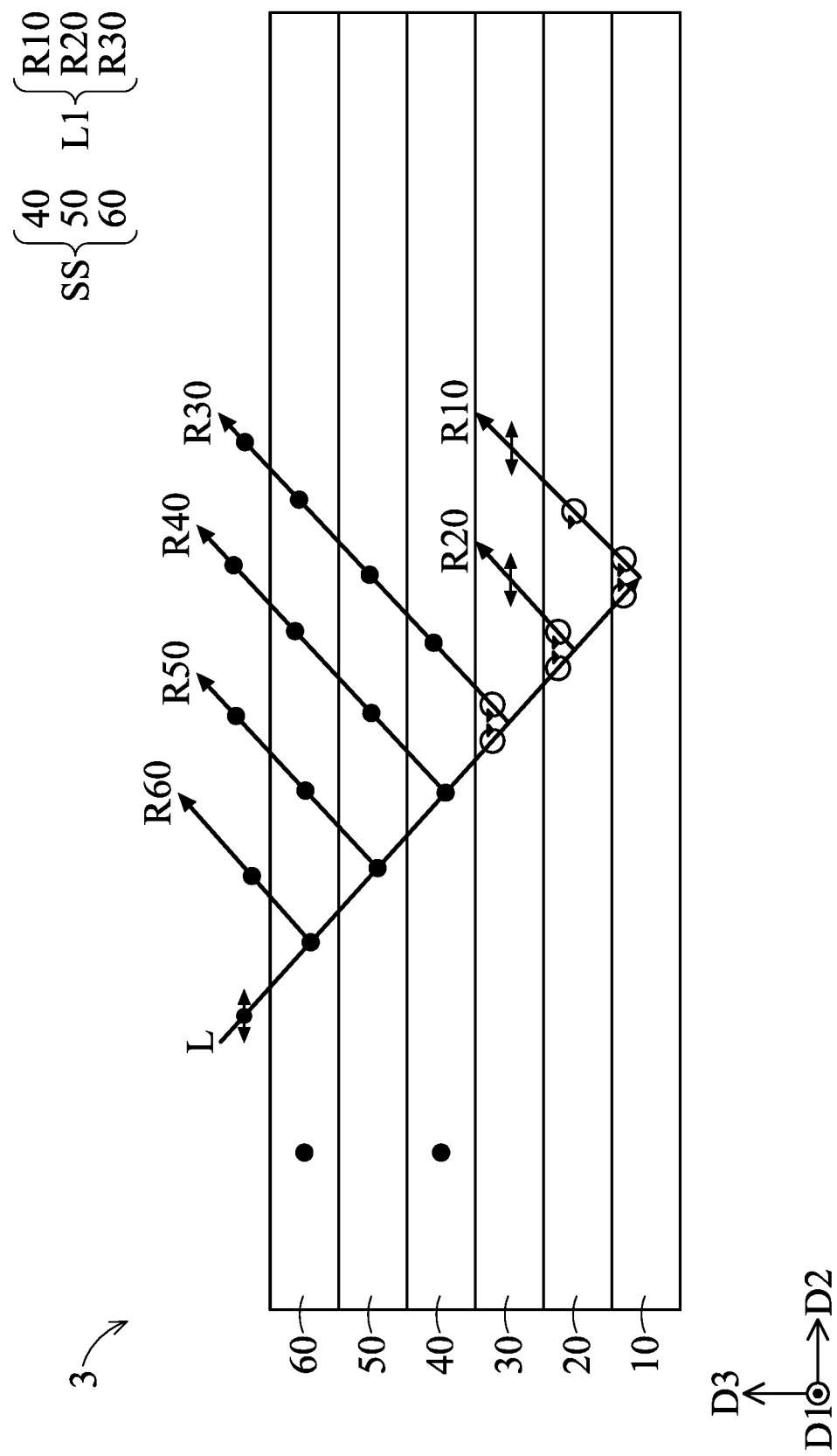
FIG. 6 is a schematic partial cross-sectional view showing an electronic device according to some embodiments of the present disclosure.

Referring to FIG. 5 and FIG. 6, which are schematic cross-sectional view and schematic partial cross-sectional view of the electronic device 3 according to some embodiments of the present disclosure, respectively.

In some embodiments, the electronic device 3 may include the viewing angle switching structure SS, and the viewing angle switching structure SS may include the first linear polarizer 40, the liquid-crystal unit 50, and the second linear polarizer 60. In some embodiments, the liquid-crystal unit 50 is disposed on the first linear polarizer 40, and the second linear polarizer 60 is disposed on the liquid-crystal unit 50. In some embodiments, the liquid-crystal unit 50 is disposed between the first linear polarizer 40 and the second linear polarizer 60. In some embodiments, the viewing angle switching structure SS may be regarded as an active privacy unit. In some embodiments, the viewing angle switching structure SS may be activated or not activated so as to switch the privacy mode and the share mode of the electronic device 3.

In some embodiments, the material of the second linear polarizer 60 and the material of the first linear polarizer 40 may be the same or different. In some embodiments, the transmission direction of the first linear polarizer 40 and/or the second linear polarizer 60 may be selected correspondingly to the type of the liquid-crystal unit 50. In some embodiments, the transmission directions of the first linear polarizer 40 and the second linear polarizer 60 may be the same or different. For example, the transmission directions of the first linear polarizer 40 and the second linear polarizer 60 may be the same or perpendicular to each other.

As shown in FIG. 5, in some embodiments, the liquid-crystal unit 50 may include a first alignment layer 52, a liquid-crystal layer 54, and a second alignment layer 56. In some embodiments, the first alignment layer 52 and the second alignment layer 56 have alignment axes, respectively. The directions of the liquid-crystal molecules 55 in the liquid-crystal layer 54 are adjusted according to the alignment directions of the alignment axes. In some embodiments, the first alignment layer 52 is closer to the display panel 10 than the second alignment layer 56. In some embodiments, the alignment directions of the first alignment layer 52 and the second alignment layer 56 are adjusted according to the type of liquid-crystal molecules 55. In some embodiments, the first alignment layer 52 and/or the second alignment layer 56 may be, or include polyimide (PI), but the present disclosure is not limited thereto.

In some embodiments, the liquid-crystal layer 54 may include a plurality of liquid-crystal molecules 55. In some embodiments, the liquid-crystal molecules 55 may be twisted nematic liquid-crystal (TN) molecules, electrically controlled birefringence (ECB) liquid-crystal molecules, vertical alignment (VA) liquid-crystal molecules, hybrid liquid-crystal molecules, dye liquid crystals, or other suitable liquid-crystal molecules, but the present disclosure is not limited thereto.

In some embodiments, the liquid-crystal unit 50 may further include a first substrate (not shown), a first electrode (not shown), a second electrode (not shown), and a second substrate (not shown). The first substrate and the second substrate may be rigid substrates or flexible substrates, and specific examples may refer to the above-mentioned example of the substrate 12. In some embodiments, the first substrate may be disposed on the first linear polarizer 40. The first electrode may be disposed on the first substrate. The first alignment layer 52 may be disposed on the first electrode. The liquid-crystal layer 54 may be disposed on the first alignment layer 52. The second alignment layer 56 may be disposed on the liquid-crystal layer 54. The second electrode may be disposed on the second alignment layer 56. The second substrate may be disposed on the second electrode. The second linear polarizer 60 may be disposed on the second substrate. In some embodiments, the first electrode and the second electrode are used to apply a voltage so that the liquid-crystal molecules 55 in the liquid-crystal layer 54 disposed between the first electrode and the second electrode are turned.

In some embodiments, the first substrate and/or the second substrate may be, or include a glass substrate, but the present disclosure is not limited thereto. In some embodiments, the first electrode and the second electrode may be, or include conductive materials. In some embodiments, the first electrode and the second electrode may be transparent conductive materials, for example, indium tin oxide (ITO), but the present disclosure is not limited thereto. In some embodiments, the conductive material may include copper (Cu), aluminum (Al), molybdenum (Mo), tungsten (W), gold (Au), chromium (Cr), nickel (Ni), platinum (Pt), titanium (Ti), silver (Ag), alloys thereof, other suitable conductive materials, or a combination of the aforementioned conductive materials, but the present disclosure is not limited thereto. In some embodiments, optically clear adhesive (OCA), optically clear resin (OCR), other suitable intermediary materials, or a combination of thereof may be further provided, but the present disclosure is not limited thereto. As shown in FIG. 5, in some embodiments, OCA, OCR, other suitable intermediary materials, or a combination of thereof may be disposed between the display panel 10 and the light-controlling layer 20, between the light-controlling layer 20 and the retardation layer 30, and/or between the retardation layer 30 and the first linear polarizer 40, but the present disclosure is not limited thereto.

In some embodiments, as shown in FIG. 5 and FIG. 6, an example may be described for illustration. The alignment direction of the first alignment layer 52 is the second direction D2. The alignment direction of the second alignment layer 56 is in the opposite direction from the second direction D2 (that is, the angle between the alignment direction of the first alignment layer 52 and the alignment direction of the second alignment layer 56 is 180 degrees). The liquid-crystal molecules 55 are ECB liquid-crystal molecules. The transmission direction of the first linear polarizer 40 and the transmission direction (for example, the third transmission direction) of the second linear polarizer 60 are the first direction D1. Light L (unpolarized light) enters the electronic device 3.

Specifically, as illustrated in FIG. 5 and FIG. 6, the light L entering the electronic device 3 may be ambient light, and the transmission direction of the light L is the first direction D1 and the second direction D2. After the light L passes through the viewing angle switching structure SS, the transmission direction of the light is the first direction D1. Moreover, the transmission directions of the reflected light R60 reflected by the second linear polarizer 60, the reflected light R50 reflected by the liquid-crystal unit 50, and the reflected light R40 reflected by the first linear polarizer 40 are the first direction D1.

Next, as shown in FIG. 6, after the light passes through the retardation layer 30, the transmission direction of the light is a left-handed circularly polarized direction. Furthermore, the transmission direction of the reflected light R30 reflected by the retardation layer 30 is right-handed circularly polarized direction. Furthermore, after the reflected light R30 passes through the viewing angle switching structure SS again, the transmission direction of the reflected light R30 is the first direction D1.

Then, as shown in FIG. 6, the light passes through the light-controlling layer 20 without changing the transmission direction of the light, so the light is still left-handed circularly polarized light. Moreover, the transmission direction of the reflected light R20 reflected by the light-controlling layer 20 is right-handed circularly polarized direction. Moreover, after the reflected light R20 passes through the retardation layer 30, the transmission direction of the reflected light R20 is the second direction D2. Since the transmission direction of the reflected light R20 is perpendicular to the transmission direction of the first linear polarizer 40, the reflected light R20 does not pass through the first linear polarizer 40 and may be blocked. Alternatively, according to an embodiment, the light amount of the reflected light R20 passing through the first linear polarizer 40 may be reduced (for example, the light is weakened, the light intensity is reduced, and/or the luminous flux is reduced).

Afterwards, the light is incident on the top surface of the display panel 10, and the transmission direction of the light is a left-handed circularly polarized direction. Furthermore, the transmission direction of the reflected light R10 reflected by the display panel 10 is right-handed circularly polarized direction. Moreover, after the reflected light R10 passes through the light-controlling layer 20, the transmission direction of the reflected light R20 is right-handed circularly polarized direction. Furthermore, after the reflected light R10 passes through the retardation layer 30, the transmission direction of the reflected light R10 is the second direction D2. Since the transmission direction of the reflected light R10 is perpendicular to the transmission direction of the first linear polarizer 40, the reflected light R10 does not pass through the first linear polarizer 40 and may be blocked. Alternatively, according to an embodiment, the light amount of the reflected light R10 passing through the first linear polarizer 40 may be reduced (for example, the light is weakened, the light intensity is reduced, and/or the luminous flux is reduced). Specifically, as shown in FIG. 5 and FIG. 6, the second transmission direction (for example, the second direction D2) of at least a portion of the incident light (marked as light L1) passing through the retardation layer 30 to enter the first linear polarizer 40 is different from the first transmission direction (for example, the first direction D1) of the first linear polarizer 40. Accordingly, when the user observes in a top view, for example, when viewing on the plane formed by the first direction D1 and the second direction D2, the user may observe the reflected lights R60, R50, R40, and R30, but will not observe the reflected lights R10 and R20 (because the reflected lights R10 and R20 are blocked by the first linear polarizer 40). Thus, according to some embodiments, by the design of the optical layer in the electronic device, the effect of low reflectivity may be achieved.

Figure 7A:
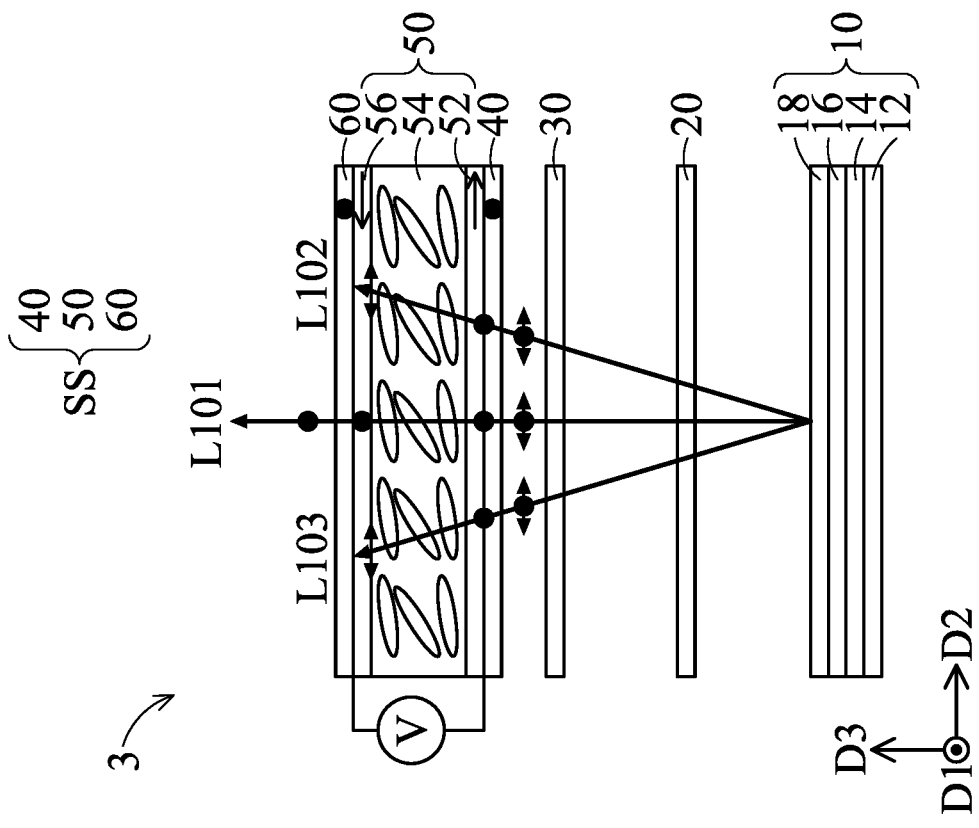
FIG. 7A and FIG. 7B are schematic cross-sectional views respectively showing an electronic device in an off-state (a non-conducting state) and an on-state (a conducting state) according to some embodiments of the present disclosure.
Figure 7B:
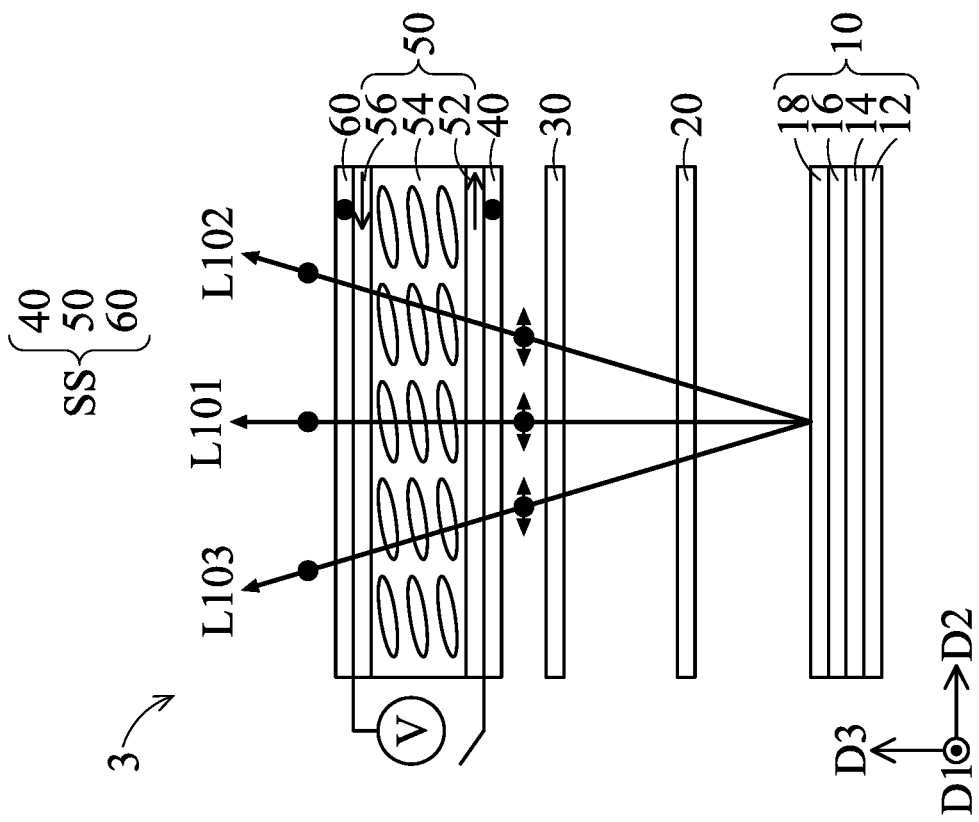

Referring to FIG. 7A and FIG. 7B, which are schematic cross-sectional views showing the electronic device 3 according to some embodiments of the present disclosure, wherein the respective viewing angle switching structures SS in the electronic device 3 are in the off-state and the on-state. Here, FIG. 7A and FIG. 7B illustrate that even if the electronic device 3 includes the retardation layer 30 and the first linear polarizer 40, the operation of the viewing angle switching structure SS will not be affected. In detail, the first linear polarizer 40 is included in the viewing angle switching structure SS, and the light emitted by the display panel 10 is still unpolarized light after the light passes through the light-controlling layer 20 and the retardation layer 30. Thus, the retardation layer 30 and the first linear polarizer 40 will not affect the operation of the viewing angle switching structure SS. Therefore, disposing the retardation layer 30 and the first linear polarizer 40 may reduce the reflection of ambient light and maintain the operation of the viewing angle switching structure SS.

As shown in FIG. 7A, in the off-state where the voltage V is not applied, the viewing angle switching structure SS is in the sharing mode, and light may be emitted at various viewing angles. In detail, the light L101-L103 emitted by the display panel 10 is unpolarized light, and the light L101-L103 is still unpolarized light after passing through the light-controlling layer 20 and the retardation layer 30. Then, the light L101-L 103 pass through the viewing angle switching structure SS in the off-state, so that the user may observe the light L101-L103 emitted by the display panel 10 at various viewing angles. As shown in FIG. 7B, in the on-state where the voltage V is applied, the viewing angle switching structure SS is in the privacy mode and light emitted at a large viewing angle may be reduced. In detail, the lights L101-L103 emitted by the display panel 10 are unpolarized lights, and the light L101-L103 are still unpolarized light after passing through the light-controlling layer 20 and the retardation layer 30. Then, the light L101-L103 pass through the viewing angle switching structure SS in the on-state, so that the viewing angle switching structure SS will weaken or block the light at the large viewing angle. For example, the transmission direction of the light with the large viewing angle (such as, the light L102 or the light L103) is different from the transmission direction of the second linear polarizer 60, and the transmission direction of the light with the large viewing angle has an included angle with the transmission direction of the second linear polarizer 60. Therefore, the light L102 or the light L103 may be weaken. In other words, since the viewing angle switching structure SS is in the on-state, a portion of the incident light (such as, the light L102 or the light L103) is blocked. In other embodiments, the sharing mode and the privacy mode of the viewing angle switching structure SS may be switched by making the voltages of the sharing mode and the privacy mode different. According to some embodiments, as shown in FIG. 7A and FIG. 7B, by using the viewing angle switching structure SS, the voltage of the upper electrode and the lower electrode (for example, the first electrode and the second electrode) in the liquid-crystal unit 50 may be adjusted, in order to switch the viewing angle of the electronic device. That is, the electronic device may further have a switchable privacy function. Furthermore, as described above in FIG. 5 and FIG. 6, the electronic device 3 may achieve the effect of reducing the reflected light while maintaining the switchable privacy function.

Referring to FIG. 8, it is a schematic cross-sectional view showing an electronic device 4 according to some embodiments of the present disclosure. In some embodiments, the types of liquid-crystal molecules 55 of the electronic device may be adjusted, and the alignment directions of the first alignment layer 52 and the second alignment layer 56 may be adjusted corresponding to the types of liquid-crystal molecules 55. For example, compared to the liquid-crystal molecules 55 of the electronic device 3 in FIG. 5 being ECB liquid-crystal molecules, the liquid-crystal molecules 55 of the electronic device 4 are TN liquid-crystal molecules. An example may be described for illustration. In some embodiments, as shown in FIG. 8, in embodiments in which the alignment direction of the first alignment layer 52 is the second direction D2, the alignment direction of the second alignment layer 56 is the first direction D1 (that is, the angle between the alignment direction of the first alignment layer 52 and the alignment direction of the second alignment layer 56 is 90 degrees). The liquid-crystal molecules 55 are TN liquid-crystal molecules. The transmission direction of the first linear polarizer 40 is the second direction D2. The transmission direction (for example, the third transmission direction) of the second linear polarizer 60 is the first direction D1. Thus, the reflectivity of the electronic device 4 may be reduced. As shown in FIG. 8, the transmission direction of the light incident from the first linear polarizer 40 to pass through the retardation layer 30 is a right-handed circularly polarized direction, and the light continues to enter the display panel 10. Next, the display panel 10 reflects the light to change the phase difference, so the transmission direction of the reflected light is a left-handed circularly polarized direction. Then, the reflected light continues to pass through the retardation layer 30. Since the retardation layer 30 is a quarter-wave plate, the transmission direction of the reflected light (light L1) is the first direction D1. Therefore, at least a portion of the reflected light (light L1) does not pass through the first linear polarizer 40 whose transmission direction is the second direction D2, so the reflected light is blocked, thereby reducing the reflectivity. Accordingly, the electronic device of the present disclosure is applicable to various types of liquid-crystal molecules 55.

In summary, according to some embodiments of the present disclosure, by the design of the optical layer in the electronic device, the first transmission direction of the first linear polarizer 40 and the second transmission direction of a portion of the incident light passing through the retardation layer 30 so as to enter the first linear polarizer 40 are different. Thus, the effect of reducing the reflection of the ambient light may be achieved. According to some embodiments, the light-controlling layer 20 is disposed between the display panel 10 and the retardation layer 30, so the electronic device may have a privacy function. According to some embodiments, the electronic device includes the viewing angle switching structure SS including the first linear polarizer 40, so the electronic device may have a switchable privacy function.

The features among the various embodiments may be arbitrarily combined as long as they do not violate or conflict with the spirit of the disclosure. In addition, the scope of the present disclosure is not limited to the process, machine, manufacturing, material composition, device, method, and step in the specific embodiments described in the specification. A person of ordinary skill in the art will understand current and future processes, machine, manufacturing, material composition, device, method, and step from the content disclosed in some embodiments of the present disclosure, as long as the current or future processes, machine, manufacturing, material composition, device, method, and step performs substantially the same functions or obtain substantially the same results as the present disclosure. Therefore, the scope of the present disclosure includes the abovementioned process, machine, manufacturing, material composition, device, method, and steps. It is not necessary for any embodiment or claim of the present disclosure to achieve all of the objects, advantages, and/or features disclosed herein.

The foregoing outlines features of several embodiments of the present disclosure, so that a person of ordinary skill in the art may better understand the aspects of the present disclosure. A person of ordinary skill in the art should appreciate that, the present disclosure may be readily used as a basis for designing or modifying other processes and structures for carrying out the same purposes and/or achieving the same advantages of the embodiments introduced herein. A person of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. An electronic device, comprising:
   a display panel, wherein the display panel comprises a surface, the surface is constituted by a first direction and a second direction, and the first direction and the second direction are perpendicular,
   wherein the display panel comprises a light-emitting layer;
   a light-controlling layer disposed on the surface of the display panel;
   a retardation layer disposed on the surface of the display panel, wherein the light-controlling layer is disposed between the display panel and the retardation layer; and
   a viewing angle switching structure disposed on the surface of the display panel, wherein the viewing angle switching structure comprises:
     a first linear polarizer, wherein the retardation layer is disposed between the light-controlling layer and the first linear polarizer;
     a liquid-crystal unit; and
     a second linear polarizer, wherein the liquid-crystal unit is disposed between the first linear polarizer and the second linear polarizer,
   wherein a first light reflected by the display panel passes through the light-controlling layer and the retardation layer to form a second light, and the second light enters to the first linear polarizer along a third direction away from the display panel, and
   wherein the first linear polarizer has a first transmission direction that is the same as the first direction, the second light has a second transmission direction that is the same as the second direction, and the third direction is perpendicular to the first direction and the second direction.

2. The electronic device as claimed in claim 1, wherein the retardation layer comprises a quarter-wave plate.

3. The electronic device as claimed in claim 2, wherein the retardation layer further comprises a half-wave plate, and the half-wave plate is disposed between the first linear polarizer and the quarter-wave plate.

4. The electronic device as claimed in claim 1, wherein the light-controlling layer has a light-shielding portion extending along the first transmission direction.

5. The electronic device as claimed in claim 4, wherein the light-controlling layer has a light-transmitting portion extending along the first transmission direction.

6. The electronic device as claimed in claim 5, wherein the light-controlling layer further comprises a first carrier substrate and a second carrier substrate, and the light-shielding portion and the light-transmitting portion are disposed between the first carrier substrate and the second carrier substrate.

7. The electronic device as claimed in claim 1, wherein the retardation layer comprises a plurality of sub-layers, and at least one of the plurality of sub-layers is a quarter-wave plate.

8. The electronic device as claimed in claim 1, wherein the retardation layer comprises a plurality of sub-layers, and one of the plurality of sub-layers closest to the light-controlling layer is a quarter-wave plate.

9. The electronic device as claimed in claim 1, wherein the display panel is an organic light-emitting display panel.

10. The electronic device as claimed in claim 1, wherein the display panel is an inorganic light-emitting display panel.

11. The electronic device as claimed in claim 1, wherein the viewing angle switching structure is in an on-state, and a portion of the second light is blocked.

12. The electronic device as claimed in claim 1, wherein the first transmission direction of the first linear polarizer and a third transmission direction of the second linear polarizer are the same.

13. The electronic device as claimed in claim 12, wherein the liquid-crystal unit comprises ECB liquid-crystal molecules.

14. The electronic device as claimed in claim 13, wherein an angle between alignment directions of alignment layers in the liquid-crystal unit is 180 degrees.

15. The electronic device as claimed in claim 1, wherein the first transmission direction of the first linear polarizer is different from a third transmission direction of the second linear polarizer.

16. The electronic device as claimed in claim 15, wherein the liquid-crystal unit comprises TN liquid-crystal molecules.

17. The electronic device as claimed in claim 16, wherein an angle between alignment directions of alignment layers in the liquid-crystal unit is 90 degrees.

* * * * *